US010465891B2

(12) United States Patent
Kusuda (10) Patent No.: US 10,465,891 B2
(45) Date of Patent: Nov. 5, 2019

(54) CIRCUIT BOARD AND LIGHTING APPARATUS

(71) Applicant: Panasonic Intellectual Property Management Co., Ltd., Osaka (JP)

(72) Inventor: Shun Kusuda, Osaka (JP)

(73) Assignee: Panasonic Intellectual Management Co., Ltd., Osaka (JP)

( * ) Notice: Subject to any disclaimer, the term of this patent is extended or adjusted under 35 U.S.C. 154(b) by 0 days.

(21) Appl. No.: 15/913,080

(22) Filed: Mar. 6, 2018

(65) Prior Publication Data

US 2018/0266667 A1 Sep. 20, 2018

(30) Foreign Application Priority Data

Mar. 17, 2017 (JP) ................................. 2017-053642

(51) Int. Cl.
*F21V 23/02* (2006.01)
*F21V 15/01* (2006.01)
(Continued)

(52) U.S. Cl.
CPC .............. *F21V 23/02* (2013.01); *F21V 15/01* (2013.01); *F21V 17/08* (2013.01); *H05B 33/0815* (2013.01); *H05B 37/02* (2013.01); *H05K 1/0233* (2013.01); *F21V 3/00* (2013.01); *F21V 7/041* (2013.01); *F21V 7/28* (2018.02); *F21W 2131/10* (2013.01); *F21Y 2115/10* (2016.08); *H05K 1/115* (2013.01); *H05K 1/181* (2013.01); *H05K 2201/09027* (2013.01); *H05K 2201/09063* (2013.01); *H05K 2201/1003* (2013.01); *H05K 2201/10015* (2013.01); *H05K 2201/10106* (2013.01); *H05K 2201/10166* (2013.01); *H05K 2201/10522* (2013.01)

(58) Field of Classification Search
CPC .......... F21V 23/02; F21V 15/01; F21V 17/08; F21V 7/28; F21V 3/00; F21V 7/041; H05B 33/0815; H05K 1/115; H05K 1/181; H05K 2201/09027; H05K 2201/10015; H05K 2201/1003; H05K 2201/10166; H05K 2201/105; F21Y 2115/10; F21W 2131/10
USPC ....................................................... 315/240
See application file for complete search history.

(56) References Cited

U.S. PATENT DOCUMENTS 9,774,229 B1 * 9/2017 Mergener ............... H02K 7/145
2011/0316494 A1 * 12/2011 Kitamura ............. H02M 1/088
323/229
(Continued)

FOREIGN PATENT DOCUMENTS

JP 04-056098 2/1992
JP 2008-016472 1/2008
(Continued)

*Primary Examiner* — Daniel D Chang
(74) *Attorney, Agent, or Firm* — Renner, Otto, Boisselle & Sklar, LLP (57) ABSTRACT

A circuit board includes: an inductor and a control IC which are included in a switching power supply circuit; and a substrate having a first face, a second face on a reverse side of the first face, and an opening in a center portion of the substrate. The inductor is disposed on the first face, the control IC is disposed on the second face, and at least part of the inductor overlaps with at least part of the control IC when viewed from a direction perpendicular to the first face.

10 Claims, 7 Drawing Sheets

(51) Int. Cl.

| | | |
|---|---|---|
| *F21V 17/08* | (2006.01) | |
| *H05B 33/08* | (2006.01) | |
| *H05K 1/02* | (2006.01) | |
| *H05B 37/02* | (2006.01) | |
| *F21Y 115/10* | (2016.01) | |
| *F21V 7/28* | (2018.01) | |
| *F21V 3/00* | (2015.01) | |
| *F21V 7/04* | (2006.01) | |
| *F21W 131/10* | (2006.01) | |
| *H05K 1/11* | (2006.01) | |
| *H05K 1/18* | (2006.01) | |

(56) References Cited

U.S. PATENT DOCUMENTS

| | | |
|---|---|---|
| 2012/0043910 A1 | 2/2012 | Nagashima |
| 2013/0301312 A1* | 11/2013 | Konishi .............. H02M 3/337 363/21.15 |
| 2014/0103837 A1 | 4/2014 | Nagashima |
| 2015/0237735 A1 | 8/2015 | Nagashima |

FOREIGN PATENT DOCUMENTS

| | | |
|---|---|---|
| JP | 2012-043722 | 3/2012 |
| JP | 2013-004389 | 1/2013 |
| JP | 2015-159020 | 9/2015 |

* cited by examiner

CIRCUIT BOARD AND LIGHTING APPARATUS

CROSS REFERENCE TO RELATED APPLICATION

This application claims the benefit of priority of Japanese Patent Application Number 2017-053642 filed on Mar. 17, 2017, the entire content of which is hereby incorporated by reference.

BACKGROUND

1. Technical Field

The present disclosure relates to a circuit board and a lighting apparatus including the circuit board.

2. Description of the Related Art

Lighting apparatuses using a light emitting element such as a light-emitting diode (LED) are known. In such lighting apparatuses, there are cases where electrical noise is a problem. Japanese Unexamined Patent Application Publication No. 2013-4389 discloses a lighting apparatus capable of reducing radiation noise generated in a light source or a power supply circuit, while reducing fabrication cost.

SUMMARY

Mounting circuit components onto a substrate having an opening adds further structural restrictions on the layout of the circuit components than when mounting circuit components on a substrate without an opening, and thus there are cases when electrical noise increases. Consequently, preventing malfunctioning due to electrical noise becomes a problem.

The present disclosure provides a circuit board for which occurrence of malfunctioning is reduced and a lighting apparatus including the circuit board.

A circuit board according to an aspect of the present disclosure includes: a plurality of circuit components included in a switching power supply circuit; and a substrate on which the plurality of circuit components are disposed, the substrate having a first face, a second face on a reverse side of the first face, and an opening in a center portion of the substrate, wherein the plurality of circuit components include a switching element, a control integrated circuit (IC) which controls turning ON and OFF of the switching element, and an inductor to which current flows in accordance with the turning ON and OFF of the switching element, the inductor is disposed on the first face, the control IC is disposed on the second face, and at least part of the inductor overlaps with at least part of the control IC when viewed from a direction perpendicular to the first face.

A lighting apparatus according to an aspect of the present disclosure includes: the above-described circuit board; and a light-emitting device which emits light using power outputted from the switching power supply circuit.

According to the present disclosure, a circuit board for which occurrence of malfunctioning is reduced and a lighting apparatus including the circuit board are realized.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Hereinafter, specific description of exemplary embodiments will be carried out with reference to the drawings. It should be noted that each of the exemplary embodiments described below represents a generic or specific example. The numerical values, shapes, materials, structural components, the arrangement and connection of the structural components, steps, the processing order of the steps, etc. shown in the following exemplary embodiments are mere examples, and are not intended to limit the scope of the present disclosure. Furthermore, among the structural components in the following exemplary embodiments, components not recited in any one of the independent claims which indicate the broadest concepts are described as arbitrary structural components.

It should be noted that the drawings are schematic diagrams, and do not necessarily provide strictly accurate illustration. Furthermore, in the respective figures, substantially identical components are assigned the same reference signs, and overlapping description may be omitted or simplified.

In the drawings in the subsequent embodiments, the Z-axis direction is, for example, the up-down direction (vertical direction), and there are cases where the Z-axis positive side is described as the top side or light exit side. Furthermore, there are instances where the Z-axis negative side is referred to as the bottom side. Furthermore, the X-axis direction and the Y-axis direction are mutually orthogonal directions in a plane (horizontal plane) perpendicular to the Z-axis. Moreover, in the subsequent embodiments, plan view refers to the view from the Z-axis direction.

Embodiment 1

[Configuration of Lighting Apparatus]

Figure 1:
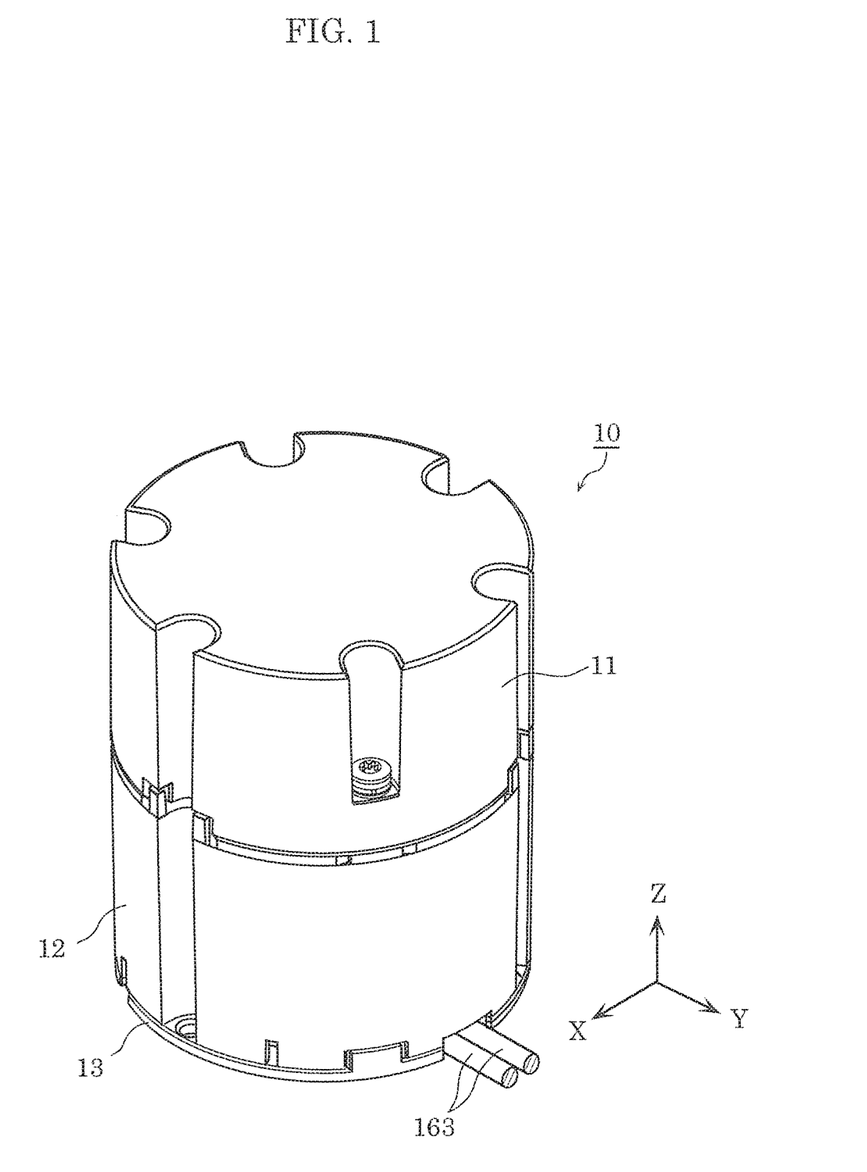
FIG. 1 is an external perspective view of a lighting apparatus including a circuit board according to Embodiment 1, as seen from the top.
Figure 2:
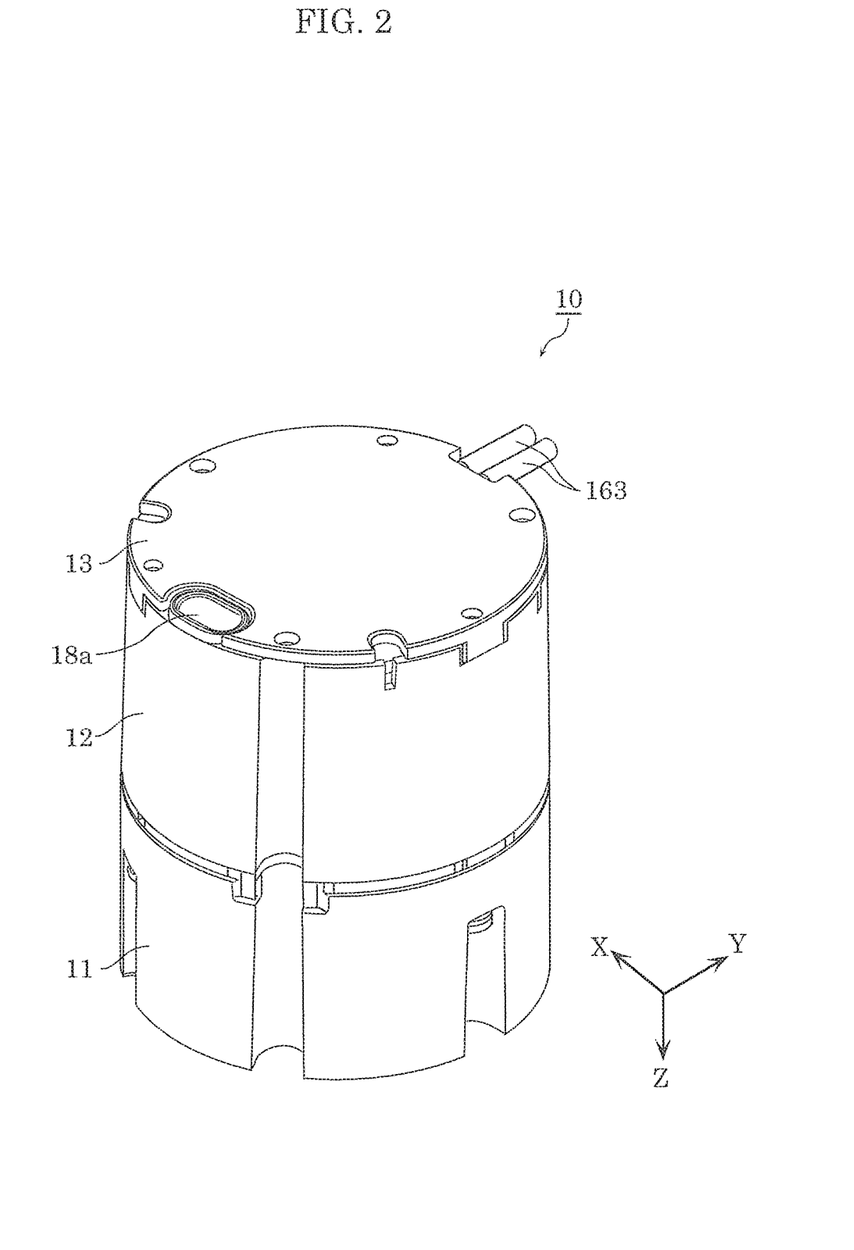
FIG. 2 is an external perspective view of the lighting apparatus including the circuit board according to Embodiment 1, as seen from below.
Figure 3:
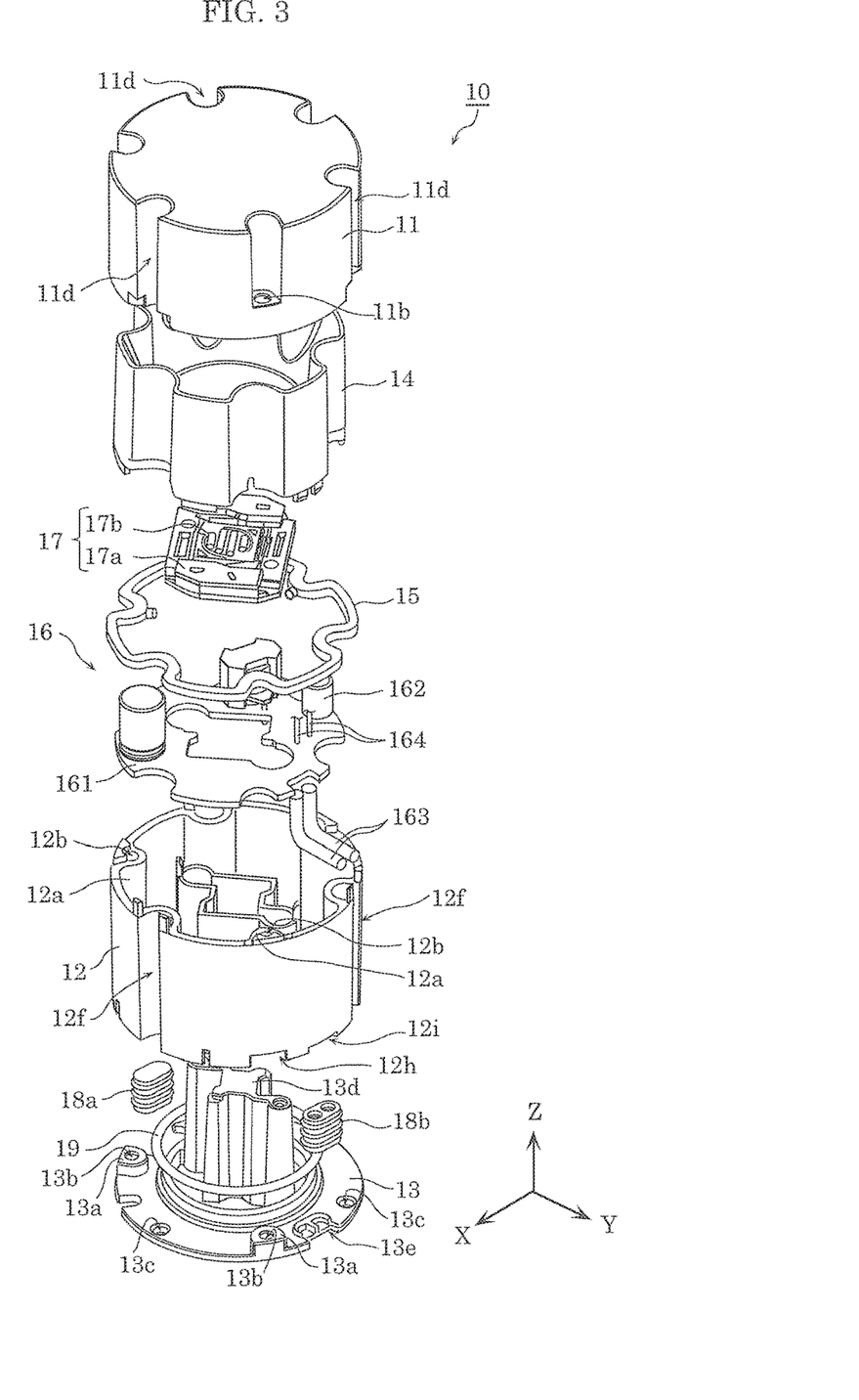
FIG. 3 is an exploded perspective view of the lighting apparatus including the circuit board according to Embodiment 1.

A configuration of a circuit board and a lighting apparatus including the circuit board, according to Embodiment 1 are described below. First, the lighting apparatus including the circuit board according to Embodiment 1 will be described using FIG. 1 to FIG. 3. FIG. 1 is an external perspective view of the lighting apparatus including the circuit board according to Embodiment 1, as seen from the top. FIG. 2 is an external perspective view of the lighting apparatus including the circuit board according to Embodiment 1, as seen from below. FIG. 3 is an exploded perspective view of the lighting apparatus including the circuit board according to Embodiment 1. It should be noted that, in FIG. 3, illustration of fasteners such as screws for fastening components together is omitted.

Lighting apparatus 10 illustrated in FIG. 1 to FIG. 3 is a lighting apparatus used in, for example, a downlight or a spotlight. As described later, lighting apparatus 10 is waterproofed using sealing components, and is therefore particularly useful as an outdoor lighting apparatus such as a lighting apparatus mounted on a low pole or a ground-recessed lighting apparatus.

Lighting apparatus 10 includes light-transmissive panel 11, case 12, base 13, reflecting component 14, sealing component 15, circuit board 16, light-emitting module 17, testing sealing component 18a, electrical wire sealing component 18b, and sealing component 19.

Light-transmissive panel 11 is an optical component made from a light-transmissive material, for bringing out the light emitted by light-emitting module 17 to the outside. Light-transmissive panel 11 is specifically a cap-shaped (cover-like) optical component. The plan view shape of light-transmissive panel 11 is circular (substantially circular) with portions cut out from the outer circumference-side.

It should be noted that light-transmissive panel 11 may have specific optical characteristics for functioning as a Fresnel lens, for example. Furthermore, light-transmissive panel 11 may include dimples for reducing unevenness of light exiting light-transmissive panel 11. In this case, the dimples are provided, for example, on the face of light-transmissive panel 11 which is on the light exit side (light exit face).

Three screw holes 11b, through which fastening screws (not illustrated) for collectively fastening light-transmissive panel 11, case 12, and base 13 together, are provided in the peripheral portion of the light exit face of light-transmissive panel 11. Furthermore, three groove portions 11d are provided in the lateral face (lateral portion) of light-transmissive panel 11. Groove portions 11d, together with groove portions 12f to be described later, form grooves that extend in the Z-axis direction. The grooves which are formed are for connecting lighting apparatus 10 to the structure to which it is to be connected, using connecting screws (not illustrated).

Light-transmissive panel 11 is disposed on the light exit side of case 12 and covers the exit aperture of reflecting component 14. Furthermore, light-transmissive panel 11 is disposed in the direction in which light-emitting module 17 emits light, and light-transmissive panel 11 and light emitter 17b oppose each other. Light-transmissive panel 11 is formed from, for example, a resin material such as acrylic (Polymethyl Methacrylate: PMMA) or polycarbonate (PC).

It should be noted that light-transmissive panel 11 need not have a light-diffusing property or may have a light-diffusing property. For example, a light-diffusing light-transmissive panel 11 can be configured by forming a milk-white light-diffusing film by applying, on the inner surface of light-transmissive panel 11, a resin, white pigment, or the like, which contains a light-diffusing material such as silica, calcium carbonate, or the like. Alternatively, light-transmissive panel 11 having a light-diffusing function can be configured by forming minute bumps and dents on light-transmissive panel 11.

Case 12 is a substantially cylindrical component that houses light-emitting module 17 and circuit board 16. Case 12 has a first opening formed on the light exit side and a second opening formed on the side opposite the light exit side. The entrance aperture portion of reflecting component 14 is disposed in the first opening, and base 13 is disposed in the second opening.

Three fastening portions 12a (bosses) having respective screw holes 12b are provided in the inner lateral face of case 12. Fastening screws are inserted through respective screw holes 12b. Three groove portions 12f, which, together with above-described groove portions 11d, form grooves, are provided in the outer lateral face of case 12.

Three cut-outs 12h, which are used for positioning and into which respective fastening portions 13a of base 13 are fitted, are provided in the Z-axis negative-side end of the lateral portion of case 12. Cut-outs 12h are positioning structures provided in case 12, for positioning base 13 with respect to case 12. Cut-out 12i for passing first electrical wires 163 for electrically connecting circuit board 16 and an external power supply is provided in the Z-axis negative side end of the lateral portion of case 12.

Case 12 is formed from, for example, an insulating resin material such as polybutylene terephthalate (PBT). It should be noted that case 12 need not be made of resin, and may be made of metal.

It should be noted that the plan view contour of each of reflecting component 14, sealing component 15, and circuit board 16 (substrate 161) is of a shape that includes cut outs corresponding to fastening portions 12a and groove portions 12f.

Base 13 includes support column 13d which projects in the Z-axis positive side, and support column 13d supports light-emitting module 17 from the back when light-emitting module 17 is to emit light forward. Base 13 is a component that also functions as a heat sink that dissipates the heat generated in light-emitting module 17, and, excluding fastening portions 13a and support column 13d, etc., is a substantially circular plate-like component.

Three fastening portions 13a having respective screw holes 13b are provided in the peripheral portion of the Z-axis positive-side main face of base 13. The inner circumferential face of screw holes 13b is threaded in conformance to the fastening screws. Fastening portions 13a are protrusions which protrude further in the Z-axis positive side than the Z-axis positive-side main face of base 13, and are fitted into cut-outs 12h.

Three connecting holes 13c through which connecting screws are inserted are provided in the peripheral portion of base 13. The connecting screws are for connecting lighting apparatus 10 to the structure to which lighting apparatus 10 is to be connected. Furthermore, cut-out 13e for passing first electrical wires 163 for electrically connecting circuit board 16 and the external power supply is provided at the edge of base 13.

Base 13 is specifically formed from a metal material such as aluminum or a resin material having high thermal conductivity.

Reflecting component 14 is a component having a reflecting function, and has an entrance aperture which is an opening into which light from light-emitting module 17 enters, and an exit aperture which is an opening from which the light which has entered from the entrance aperture exits. Reflecting component 14 is a truncated cone-like component configured to have an inner diameter that gradually increases from the entrance aperture toward the exit aperture.

The entrance aperture portion of reflecting component 14 surrounds light emitter 17b of light-emitting module 17. Furthermore, the shape of the exit aperture corresponds to the shape of the light exit face (Z-axis positive-side face) of light-transmissive panel 11.

The inner face of reflecting component 14 is a reflecting face that reflects the light emitted by light-emitting module 17. The light entering from the entrance aperture is reflected by the reflecting face and exits from the exit aperture. In other words, the light emitted by light-emitting module 17 is guided to light-transmissive panel 11 by reflecting component 14. Reflecting component 14 is to be attached to case 12.

Reflecting component 14 is configured of, for example, a hard white resin material having an insulating property. It should be noted that, in order to enhance the outward appearance of the reflecting face and/or control the light distribution of lighting apparatus 10, the inner face of resin reflecting component 14 may be coated with a vapor-deposited metal film (metal reflecting film) of a metal material such as silver or aluminum. Furthermore, reflecting component 14 may be formed using a metal material, such as aluminum, which has higher reflectivity than a resin material.

Sealing component 15 is an elastic resin component with a deformed ring shape. Sealing component 15 is specifically formed from rubber, elastomer, etc. Sealing component 15 is sandwiched between light-transmissive panel 11 and case 12. Specifically, sealing component 15 is sandwiched between the end face of light-transmissive panel 11 and the first opening-side end face of case 12 by way of light-transmissive panel 11 and case 12 being fastened together through the tightening of fastening screws. Specifically, sealing component 15 seals the space between the end face of light-transmissive panel 11 and the first opening-side end face of case 12.

Furthermore, sealing component 15 surrounds reflecting component 14, and the inner circumference face of sealing component 15 contacts the outer face of reflecting component 14. Reflecting component 14 functions as a guide (positioning structure) for positioning sealing component 15 between the end face of light-transmissive panel 11 and the first opening-side end face of case 12.

Light-emitting module 17 is an example of a light-emitting device, and emits light of a predetermined color (wavelength) such as white using power outputted from a switching power supply circuit mounted on substrate 161. The light emitted from light-emitting module 17 passes through light-transmissive panel 11 and is emitted to the outside of lighting apparatus 10. It should be noted that circuit board 16 and light-emitting module 17 are electrically connected via second electrical wires 164.

Holder 17a is a resin component that holds light emitter 17b, and light-emitting module 17 is attached to base 13 by screwing holder 17a to support column 13d. Furthermore, second electrical wires 164 are inserted into holder 17a, and inserted second electrical wires 164 are electrically connected to light emitter 17b by way of a connection terminal inside holder 17a.

Light emitter 17b is a light emitting unit having a chip-on-board (COB) structure in which LEDs (light-emitting elements) are directly mounted on a substrate, and the LEDs are sealed using a sealant. It should be noted that, although not illustrated in the figure, the bottom face of the substrate of light-emitting unit 17b is exposed from holder 17a and abuts support column 13d of base 13.

Testing sealing component 18a is a sealing component that covers up an opening for testing airtightness provided at the bottom face of lighting apparatus 10. Testing sealing component 18a is formed from an elastic resin component. Specifically, the elastic resin component includes rubber, elastomer, etc.

Electrical wire sealing component 18b is a sealing component through which first electrical wires 163 for electrically connecting circuit board 16 and the external power supply are inserted. Electrical wire sealing component 18b seals the space between case 12 and first electrical wires 163. Electrical wire sealing component 18b is formed from an elastic resin component. Specifically, the elastic resin component includes rubber, elastomer, etc.

Sealing component 19 is what is called an O-ring and is sandwiched between base 13 and case 12 to seal the space between case 12 and base 13 when case 12 and base 13 are fastened together using fastening screws. Sealing component 19 is formed from an elastic resin component (rubber, elastomer, etc.).

(Circuit Board)

Figure 4:
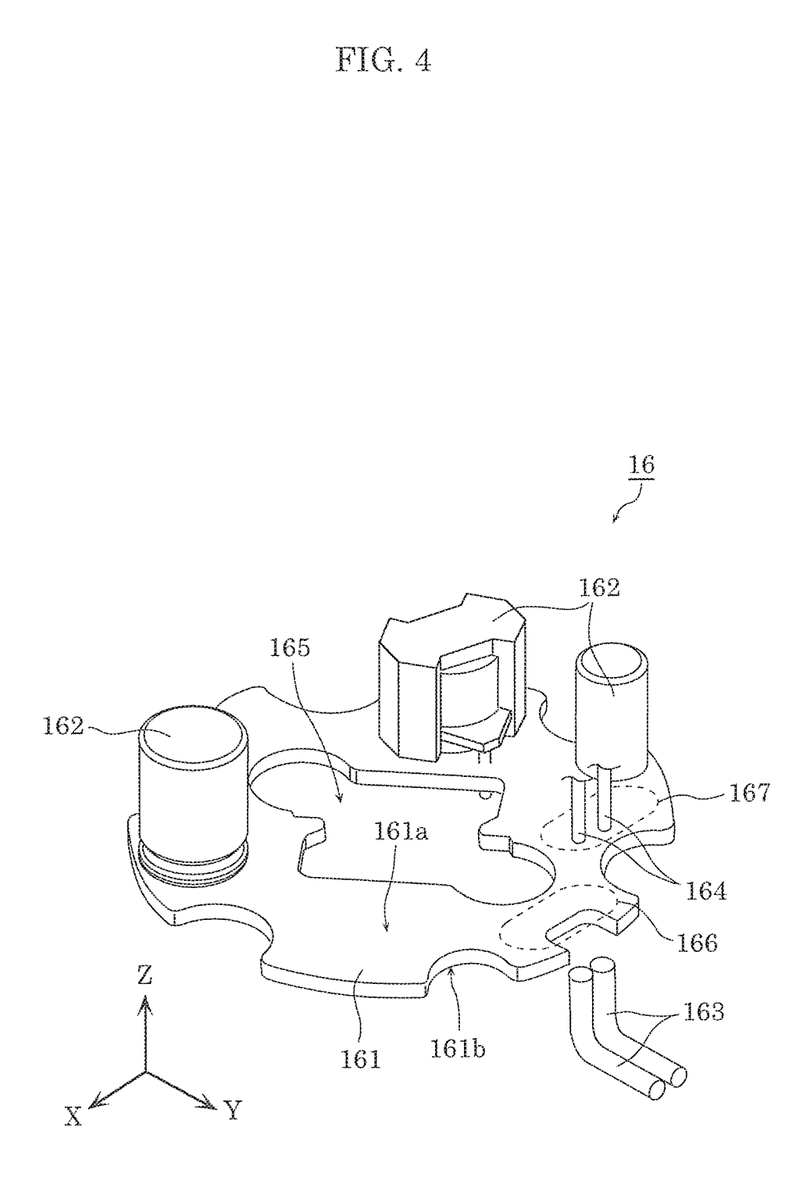
FIG. 4 is an external perspective view of the circuit board according to Embodiment 1.

Next, the configuration of circuit board 16 will be described using FIG. 4 in addition to FIG. 3. FIG. 4 is an external perspective view of circuit board 16.

As illustrated in FIG. 3 and FIG. 4, circuit board 16 includes substrate 161, circuit components 162, first electrical wires 163, second electrical wires 164, input terminal 166, and output terminal 167.

Substrate 161 is a board component having, at the center portion, opening 165. Substrate 161 is an annular (donut-shaped) substrate with portions cut out from the outer circumference side. Substrate 161 is fastened inside case 12 using a locking claw (not illustrated) provided in case 12. Substrate 161 is disposed inside of case 12 and outside of reflecting component 14. Opening 165 has a shape corresponding to support column 13d, and support column 13d passes through opening 165.

Substrate 161 is a printed board on which wiring is formed by patterning. A ceramic substrate, a resin substrate, or a metal base substrate, etc. is used for substrate 161.

Specifically, substrate 161 has first face 161a and second face 161b on the reverse side of first face 161. Stated differently, first face 161a is one principal face of substrate 161, and second face 161b is the other principal face on the reverse side of the one principal face.

Each of circuit components 162 is disposed on either one of first face 161a and second face 161b of substrate 161. Circuit components 162 form a switching power supply circuit. The switching power supply circuit is a circuit that supplies power to light-emitting module 17, and causes light-emitting module 17 to emit light.

First electrical wires 163 are cables for electrically connecting circuit board 16 and the external power supply. One end of first electrical wires 163 is electrically connected to input terminal 166 disposed in substrate 161 (first electrical wires 163 and input terminal 166 are separated in the drawing but are actually connected). The other end of first electrical wires 163 is drawn to the outside of case 12 via cut-out 12i.

Input terminal 166 is an input terminal of the switching power supply circuit formed by circuit components 162. In other words, input terminal 166 is an input terminal for supplying power to the switching power supply circuit. Input terminal 166 is schematically illustrated using a broken line in FIG. 4. Input terminal 166 may be disposed in first face 161a or second face 161b of substrate 161. In other words, first electrical wires 163 may be connected to first face 161a or second face 161b of substrate 161.

Second electrical wires 164 are cables for electrically connecting circuit board 16 and light-emitting module 17. One end of second electrical wires 164 is electrically connected to output terminal 167 disposed in substrate 161. The other end of second electrical wires 164 is inserted into holder 17a of light-emitting module 17, and electrically connected to light emitter 17b by way of a connection terminal inside holder 17a.

Output terminal 167 is an output terminal of the switching power supply circuit formed by circuit components 162. In other words, power from the switching power supply circuit is outputted to output terminal 167. Output terminal 167 is schematically illustrated using a broken line in FIG. 4. Output terminal 167 may be disposed in first face 161a or second face 161b of substrate 161. In other words, second electrical wires 164 may be connected to first face 161a or second face 161b of substrate 161.

(Circuit Configuration of Switching Power Supply Circuit)

Figure 5:
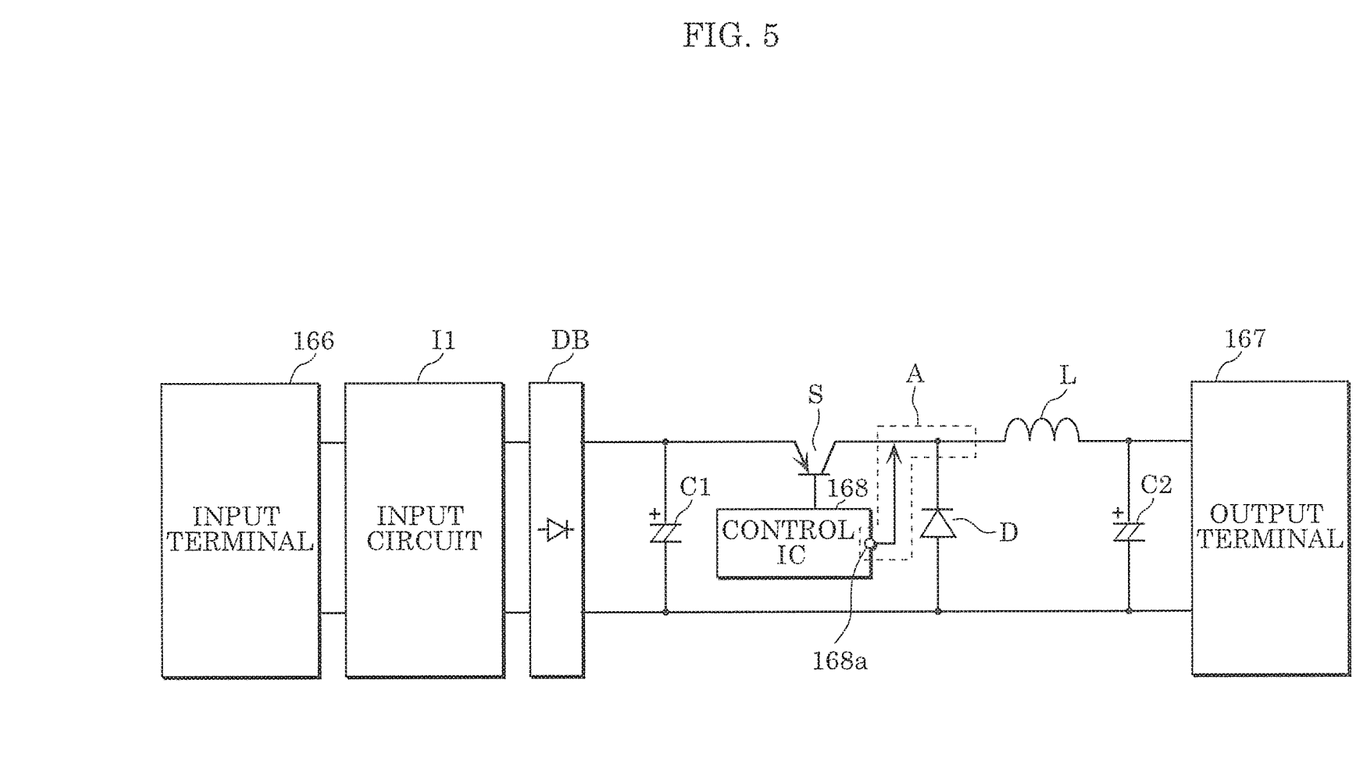
FIG. 5 is a diagram illustrating a circuit configuration of a switching power supply circuit.

Next, the circuit configuration of the switching power supply circuit will be described. FIG. 5 is a diagram illustrating the circuit configuration of the switching power supply circuit.

As illustrated in FIG. 5, circuit components 162 which form the switching power supply circuit include input terminal 166, input circuit IL diode bridge DB, smoothing capacitor C1, switching element S, control integrated circuit (IC) 168, diode D, inductor L, smoothing capacitor C2, and output terminal 167.

For example, a sine wave alternating-current (AC) voltage is supplied from a power system to input terminal 166. Input circuit I1 is for example a filter circuit that reduces the high frequency component, etc., of the sine wave AC voltage. Diode bridge DB, which is a full-wave rectifier in which four diodes are connected in a bridge configuration, performs full-wave rectification of the AC voltage outputted from the filter circuit and outputs direct-current (DC) voltage.

Smoothing capacitor C1 smooths the DC voltage (ripple voltage) outputted from diode bridge DB. Control IC 168 includes monitoring terminal 168a for monitoring the current flowing to inductor L, and performs switching of the DC current that has been smoothed by smoothing capacitor C1. In other words, control IC 168 controls the turning ON and OFF of switching element S. With this, high frequency voltage is outputted to inductor L. Switching element S is, for example, a bipolar transistor, but may be a field effect transistor (FET).

Specifically, inductor L is a choke coil (choke transformer) to which current flows in accordance with the ON and OFF state of switching element S. Diode D is a recirculation diode which recirculates current when switching element S is OFF. Smoothing capacitor C2 smooths the current outputted from inductor L. The current that has been smoothed by smoothing capacitor C2 is outputted from output terminal 167.

(Layout of Circuit Components)

Figure 6:
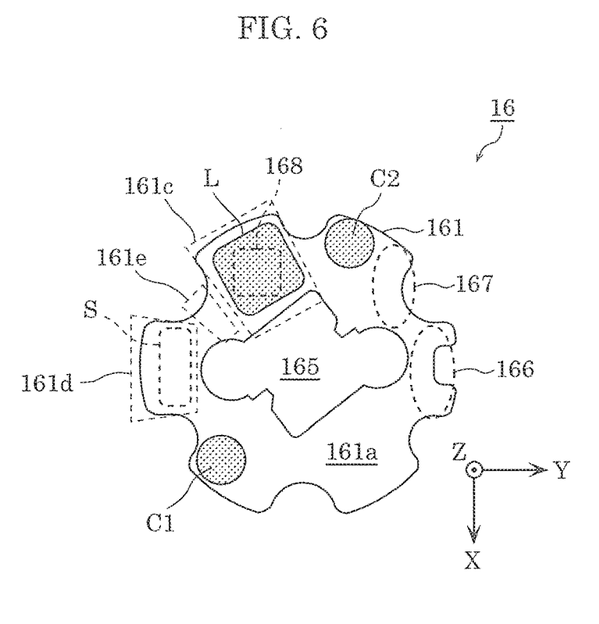
FIG. 6 is a diagram illustrating a component layout in a first face the circuit board according to Embodiment 1.
Figure 7:
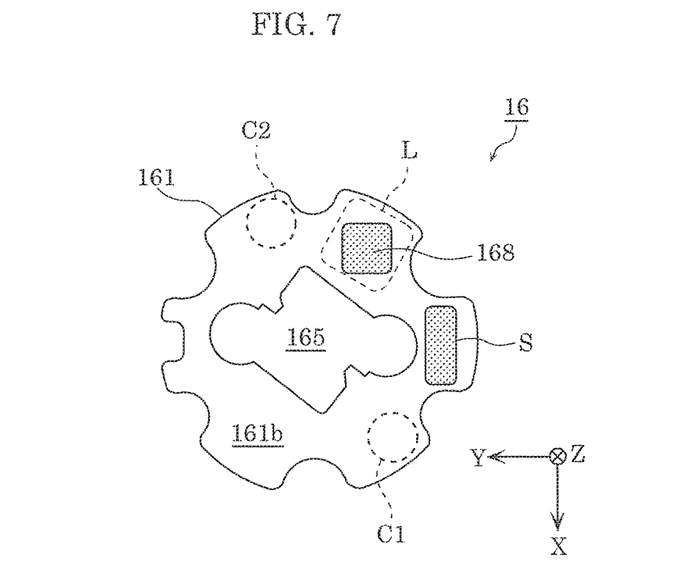
FIG. 7 is a diagram illustrating a component layout in a second surface the circuit board according to Embodiment 1.

In circuit board 16, circuit components 162 which form a switching power supply circuit such as that described above are disposed as illustrated in FIG. 6 and FIG. 7. FIG. 6 is a diagram illustrating a component layout in first face 161a of circuit board 16. FIG. 7 is a diagram illustrating a component layout in second face 161b of circuit board 16.

As described above, the form of substrate 161 is that of a board with an annular shape due to opening 165, from which portions have been cut out from the outside. Specifically, wide portions and narrow portions, which are smaller than the wide portions in width from the outer edge to the inner edge, are alternately provided in a continuous manner in the circumferential direction in substrate 161. For example, as illustrated in FIG. 6, substrate 161 includes first wide portion 161c, second wide portion 161d, and narrow portion 161e located between first wide portion 161c and second wide portion 161d. It should be noted that there are six wide portions and six narrow portions in substrate 161.

In substrate 161 having such a complex shape, large circuit components 162 cannot be placed in the narrow portions. In other words, large circuit components 162 can only be placed in the wide portions. For example, as illustrated in FIG. 6, inductor L, smoothing capacitor C1, and smoothing capacitor C2 are disposed on first face 161a, in respective wide portions. Furthermore, as illustrated in FIG. 7, switching element S and control IC 168 are disposed on second face 161b, in respective wide portions.

Because circuit board 16 has such structural restrictions on component layout, wires tend to become long. In view of this, the layout of circuit components 162 in circuit board 16 has been thought out.

For example, as illustrated in FIG. 6 and FIG. 7, inductor L is disposed on first face 161a, in first wide portion 161c among the wide portions, and control IC 168 is disposed on second face 161b, in first wide portion 161c. Then, when viewed from a direction perpendicular to first face 161a (i.e., the Z-axis direction), at least part of inductor L overlaps with at least part of circuit IC 168. It should be noted that, although, in circuit board 16, the entirety of control IC 168 overlaps with at least part of inductor L when viewed from a direction perpendicular to first face 161a, it is sufficient that at least part of circuit IC 168 overlaps with at least part of inductor L.

With this, the wire that electrically connects control IC 168 and inductor L can be shortened by using a conducting via structure, etc. As such, it is possible to reduce entry of noise to the wire as well as generation of noise from the wire due to the wire being long (i.e., acting as an antenna). Specifically, for example, wire A from monitoring terminal 168a of control IC 168 to inductor L (illustrated in FIG. 5) can be shortened.

Furthermore, switching element S is disposed in second wide portion 161d next to first wide portion 161c, among the wide portions. More specifically, switching element S is disposed on second face 161b, in second wide portion 161d.

With this, the wire that electrically connects control IC 168 and switch element S can be shortened, and thus it is possible to reduce entry of noise to the wire as well as generation of noise from the wire due to the wire being long. It should be noted that switching element S may be disposed on first face 161a, in second wide portion 161d.

Furthermore, as illustrated in FIG. 6, when viewed from a direction perpendicular to first face 161a, input terminal 166 and output terminal 167 are disposed side-by-side. In other words, input terminal 166 and output terminal 167 are next to each other.

Accordingly, by having circuit components 162 laid out clockwise (in one direction) on substrate 161, sequentially from circuit components 162 located on the input side in the circuit diagram, the wire is prevented from having to go back and forth in clockwise and counterclockwise directions. Specifically, the wire as a whole can be shortened, and thus it is possible to reduce entry of noise to the wire as well as generation of noise from the wire due to the wire being long. It should be noted that in order to prevent the wire from having to go back and forth, it is advantageous to have few circuit components 162 disposed on the portion between input terminal 166 and output terminal 167 of substrate 161. Other circuit components need not be disposed on this portion.

Figure 8:
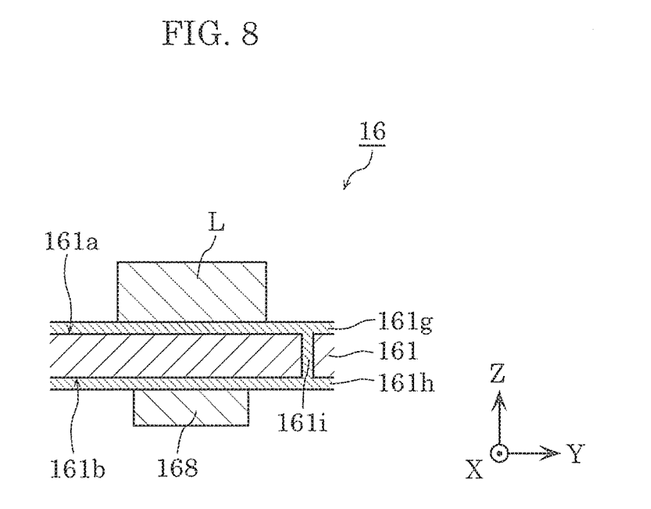
FIG. 8 is a cross-sectional view of the circuit board according to Embodiment 1.

It should be noted that, when inductor L and control IC 168 are disposed on different faces of substrate 161 as described above, a conducting via structure (a through hole via) may be used in the electrical connection of inductor L and control IC 168. FIG. 8 is a cross-sectional view of circuit board 16.

As illustrated in FIG. 8, circuit board 16 includes first wire layer 161g and second wire layer 161h which are stacked with substrate 161 disposed therebetween, and conducting via structure 161i which penetrates substrate 161. First wire layer 161g is disposed on first face 161a of substrate 161, and second wire layer 161h is disposed on second face 161b of substrate 161.

Inductor L is electrically connected to a first wire included in first wire layer 161g, and control IC 168 is electrically connected to a second wire included in second wire layer 161h. Conducting via structure 161i electrically connects the first wire and the second wire. First wire layer 161g and second wire layer 161h are formed from a metal material such as copper. It should be noted that, except for the portion required for the electrical connection with inductor L, the surface of first wire layer 161g may be covered by a cover resist. This is the same for the surface of second wire layer 161h.

With such conducting via structure 161i, the wire electrically connecting control IC 168 and inductor L can be shortened.

[Variation]

Figure 9:
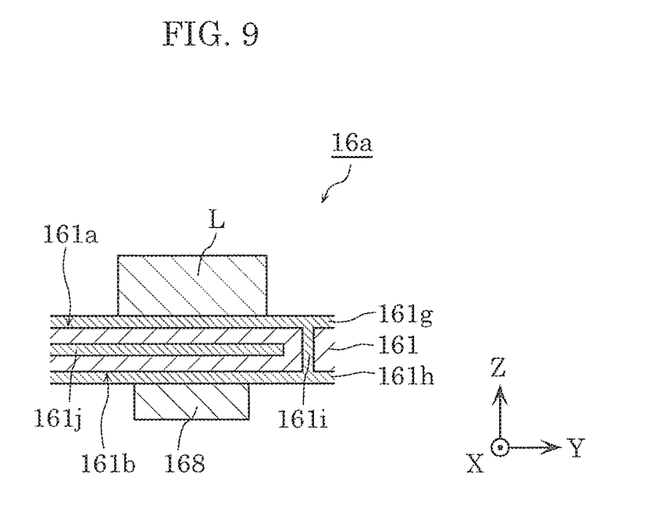
FIG. 9 is a cross-sectional view of a circuit board according to a variation.

Meanwhile, there are instances where trouble such as malfunctioning occurs in control IC 168 due to the effects of radiation noise generated by other electronic components. In view of this, a shield pattern may be included in an inner layer (an inner wire layer) of substrate 161. FIG. 9 is a cross-sectional view of a circuit board according such a variation. It should be noted that the subsequent description is carried out centering on the differences of circuit board 16a according to this variation from circuit board 16.

Circuit board 16a according to the variation as illustrated in FIG. 9, includes first wire layer 161g, second wire layer 161h, and third wire layer 161j. First wire layer 161g is disposed on first face 161a of substrate 161, and second wire layer 161h is disposed on second face 161b of substrate 161. Third wire layer 161j is located between first wire layer 161g and second wire layer 161h, inside substrate 161.

Inductor L is electrically connected to a first wire included in first wire layer 161g, and control IC 168 is electrically connected to a second wire included in second wire layer 161h.

Third wire layer 161j includes a shield pattern located between inductor L and control IC 168. The shield pattern is, for example, a wiring pattern that serves as a signal ground (to which reference voltage is applied), but may be a floating pattern.

Such a shield pattern reduces the effect that radiation noise generated by circuit components such as the inductor L has on control IC 168. As such, the occurrence of trouble such as the malfunctioning of control IC 168 can be reduced.

[Advantageous Effects, etc.]

As described above, circuit board 16 includes: a plurality of circuit components 162 included in a switching power supply circuit; and substrate 161 on which circuit components 162 are disposed, and which has first face 161a, second face 161b on the reverse side of first face 161a, and opening 165 in a center portion of substrate 161. The plurality of circuit components 162 include switching element S, control IC 168 which controls turning ON and OFF of switching element S, and inductor L to which current flows in accordance with the turning ON and OFF of switching element S. Inductor L is disposed on first face 161a, control IC 168 is disposed on second face 161b, and at least part of inductor L overlaps with at least part of control IC 168 when viewed from a direction perpendicular to first face 161a.

With this, the wire that electrically connects control IC 168 and inductor L can be shortened by using a conducting via structure, etc. As such, it is possible to reduce entry of noise to a wire as well as generation of noise from the wire due to the wire being long (i.e., acting as an antenna). Therefore, malfunctioning of circuit board 16 can be reduced.

Furthermore, input terminal 166 for supplying power to the switching power supply circuit and output terminal 167 for outputting power from the switching power supply circuit may be disposed in substrate 161. Furthermore, input terminal 166 and output terminal 167 may be disposed side-by-side when viewed from the direction perpendicular to first face 161a.

Accordingly, by having circuit components 162 laid out in one direction on substrate 161, sequentially from circuit components 162 located on the input side in the circuit diagram, the wire is prevented from having to go back and forth. Specifically, the wire as a whole can be shortened, and thus it is possible to reduce entry of noise to the wire as well as generation of noise from the wire due to the wire being long.

Furthermore, circuit board 16 may include: first wire layer 161g disposed on first face 161a; second wire layer 161h disposed on second face 161b; and conducting via structure 161i penetrating through substrate 161. Inductor L is electrically connected to a first wire included in first wire layer 161g, control IC 168 is electrically connected to a second wire included in second wire layer 161h, and conducting via structure 161i electrically connects the first wire and the second wire.

Accordingly, by using conducting via structure 161i, the wire that electrically connects control IC 168 and inductor L can be shortened. As such, it is possible to reduce entry of noise to the wire as well as generation of noise from the wire due to the wire being long.

Furthermore, like circuit board 16a, circuit board 16 may include: first wire layer 161g disposed on first face 161a; second wire layer 161h disposed on second face 161b; and third wire layer 161j disposed in substrate 161, in between first face 161a and second face 161b. Inductor L is electrically connected to a first wire included in first wire layer 161g, control IC 168 is electrically connected to a second wire included in second wire layer 161h, and third wire layer 161j includes a shield pattern located between first wire layer 161g and second wire layer 161h in a stacking direction and located between inductor L and control IC 168 in the stacking direction.

Such a shield pattern reduces the effect that radiation noise generated by circuit components such as the inductor L has on control IC 168. As such, the occurrence of trouble such as the malfunctioning of control IC 168 can be reduced.

Furthermore, substrate 161 may have a plurality of wide portions and a plurality of narrow portions 161e which are located between the plurality of wide portions and are smaller than the plurality of wide portions in width from an outer edge to an inner edge of substrate 161. Inductor L is disposed on first face 161a, in first wide portion 161c included in the plurality of wide portions, and control IC 168 is disposed on second face 161b, in first wide portion 161c.

Accordingly, in substrate 161 having an irregular annular shape for which structural restrictions on the layout of circuit components is severe, the wire electrically connecting control IC 168 and inductor L can be shortened. As such, it is possible to reduce entry of noise to the wire as well as generation of noise from the wire due to the wire being long.

Furthermore, switching element S may be disposed in second wide portion 161d next to first wide portion 161c, among the wide portions.

With this, the wire that electrically connects control IC 168 and switch element S can be made short, and thus it is possible to reduce entry of noise to the wire as well as generation of noise from the wire due to the wire being long.

Furthermore, lighting apparatus 10 includes circuit board 16 (or circuit board 16a) and light-emitting module 17 which emits light using power outputted from the switching power supply circuit. Light-emitting module 17 is an example of a light-emitting device.

In such light apparatus 10, the wire electrically connecting control IC 168 and inductor L is shortened. As such, it is possible to reduce entry of noise to the wire as well as generation of noise from the wire due to the wire being long (i.e., acting as an antenna). Therefore, malfunctioning of lighting apparatus 10 can be reduced.

Other Embodiments

Although the circuit substrate and the lighting apparatus according to the foregoing embodiments have been described thus far, the present disclosure is not limited to the foregoing embodiments.

For example, the configuration of the switching power supply circuit described in the foregoing embodiments is an example. Any switching power supply circuit that can realize the characteristic functions of the present invention in the same manner as the above-described switching power supply circuit is also included in the present invention. For example, an element such as a switching element (transistor), a resistor, or a capacitor, etc. may be connected in series or in parallel to an element, within a scope in which the same function as the above-described switching power supply circuit can be realized.

Furthermore, although an example in which the circuit board according to the present disclosure is applied to a lighting apparatus is described in the foregoing embodiments, the circuit board according to the present disclosure can be widely used in various electrical devices aside from a lighting apparatus.

Furthermore, although the light-emitting module is a COB light-emitting module in the forgoing embodiments, the light-emitting module may be of the surface mount device (SMD)-type.

Furthermore, although LEDs are used as light-emitting elements in the light-emitting module in the forgoing embodiments, it is acceptable to use other solid-state light-emitting elements such as semiconductor light-emitting elements such as a semiconductor laser, or organic electro luminescence (EL) elements or non-organic EL or non-organic EL elements.

Although a circuit board and a lighting apparatus according to one or more aspects has been described based on the foregoing embodiments, the present disclosure is not limited to these embodiments. Forms obtained by various modifications to the exemplary embodiments that can be conceived by a person of skill in the art as well as forms realized by combining structural components in different exemplary embodiments, which are within the scope of the essence of the present disclosure may be included in the one or more aspects.

What is claimed is:

1. A circuit board, comprising:
a plurality of circuit components included in a switching power supply circuit; and
a substrate on which the plurality of circuit components are disposed, the substrate having a first face, a second face on a reverse side of the first face, and an opening in a center portion of the substrate, wherein
the plurality of circuit components include a switching element, a control integrated circuit (IC) which controls turning ON and OFF of the switching element, and an inductor to which current flows in accordance with the turning ON and OFF of the switching element,
the inductor is disposed on the first face,
the control IC is disposed on the second face,
at least part of the inductor overlaps with at least part of the control IC when viewed from a direction perpendicular to the first face, and
the inductor is a choke coil.

2. The circuit board according to claim 1, wherein
an input terminal for supplying power to the switching power supply circuit and an output terminal for outputting power from the switching power supply circuit are disposed in the substrate, and
the input terminal and the output terminal are disposed side-by-side when viewed from the direction perpendicular to the first face.

3. The circuit board according to claim 1, comprising:
a first wire layer disposed on the first face;
a second wire layer disposed on the second face; and
a conducting via structure penetrating through the substrate, wherein
the inductor is electrically connected to a first wire included in the first wire layer,
the control IC is electrically connected to a second wire included in the second wire layer, and
the conducting via structure electrically connects the first wire and the second wire.

4. The circuit board according to claim 1, comprising:
a first wire layer disposed on the first face;
a second wire layer disposed on the second face; and
a third wire layer disposed in the substrate, in between the first face and the second face, wherein
the inductor is electrically connected to a first wire included in the first wire layer,
the control IC is electrically connected to a second wire included in the second wire layer, and
the third wire layer includes a shield pattern located between the first wire layer and the second wire layer in a stacking direction and located between the inductor and the control IC in the stacking direction.

5. The circuit board according to claim 1, wherein
the substrate has:
a plurality of wide portions; and
a plurality of narrow portions which are located between the plurality of wide portions and are smaller than the plurality of wide portions in width from an outer edge to an inner edge of the substrate,
the inductor is disposed on the first face, in a first wide portion included in the plurality of wide portions, and the control IC is disposed on the second face, in the first wide portion.

6. The circuit board according to claim 5, wherein the switching element is disposed on a second wide portion next to the first wide portion, the second wide portion being included in the plurality of wide portions.

7. The circuit board according to claim 6, wherein the plurality of circuit components include a smoothing capacitor which smooths current outputted from the inductor, and the smoothing capacitor is disposed in a wide portion located on a side of the first wide portion opposite a side on which the second wide portion is disposed, the wide portion being included in the plurality of wide portions.

8. A lighting apparatus, comprising:
the circuit board according to claim 1; and
a light-emitting device which emits light using power outputted from the switching power supply circuit.

9. The lighting apparatus according to claim 8, further comprising:
a base including a support column which supports the light-emitting device, wherein
the support column passes through the opening.

10. The lighting apparatus according to claim 9, further comprising:
a light-transmissive panel which transmits the light emitted by the light-emitting device; and
a fastener which fastens the light-transmissive panel and the base together.

* * * * *

UNITED STATES PATENT AND TRADEMARK OFFICE
CERTIFICATE OF CORRECTION

PATENT NO. : 10,465,891 B2
APPLICATION NO. : 15/913080
DATED : November 5, 2019
INVENTOR(S) : Shun Kusuda It is certified that error appears in the above-identified patent and that said Letters Patent is hereby corrected as shown below:

On the Title Page

Item (73), Line 1, Assignee name should read --"Panasonic Intellectual Property Management Co., Ltd., Osaka (JP)"--

Signed and Sealed this
Twenty-eighth Day of April, 2020

Andrei Iancu
*Director of the United States Patent and Trademark Office*